United States Patent
Adkisson et al.

(10) Patent No.: US 7,923,750 B2
(45) Date of Patent: Apr. 12, 2011

(54) PIXEL SENSOR CELL, METHODS AND DESIGN STRUCTURE INCLUDING OPTICALLY TRANSPARENT GATE

(75) Inventors: James William Adkisson, Jericho, VT (US); Rajendran Krishnasamy, Essex Junction, VT (US); John Joseph Ellis-Monaghan, Grand Isle, VT (US); Solomon Mulugeta, Essex Junction, VT (US); Charles Francis Musante, South Burlington, VT (US); Richard J. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 12/139,524

(22) Filed: Jun. 16, 2008

(65) Prior Publication Data
US 2009/0309143 A1    Dec. 17, 2009

(51) Int. Cl.
*H01L 31/062* (2006.01)
*H01L 31/113* (2006.01)
*H01L 31/00* (2006.01)
*H01L 29/74* (2006.01)
*H01L 31/111* (2006.01)

(52) U.S. Cl. .............. 257/123; 257/292; 257/444
(58) Field of Classification Search ............... 257/123, 257/292, E27.133, 444
See application file for complete search history.

(56) References Cited

U.S. PATENT DOCUMENTS

| 4,807,004 | A | 2/1989 | Wan et al. |
| 5,365,092 | A | 11/1994 | Janesick |
| 5,798,542 | A | 8/1998 | Anagnostopoulos et al. |
| 5,804,845 | A | 9/1998 | Anagnostopoulos et al. |
| 5,891,752 | A | 4/1999 | Losee |
| 2002/0109157 | A1* | 8/2002 | Rhodes ................ 257/222 |
| 2006/0187327 | A1* | 8/2006 | Mabuchi et al. ........... 348/294 |
| 2008/0022250 | A1* | 1/2008 | Nagarajan et al. ........... 716/10 |

* cited by examiner

*Primary Examiner* — William M. Brewster
(74) *Attorney, Agent, or Firm* — Scully, Scott, Murphy & Presser, P.C.; Anthony Canale

(57) ABSTRACT

A pixel sensor cell, a method for fabricating or operating the pixel sensor cell and a design structure for fabricating the pixel sensor cell each include a semiconductor substrate that includes a photoactive region separated from a floating diffusion region by a channel region. At least one gate dielectric is located upon the semiconductor substrate at least in-part interposed between the photoactive region and the floating diffusion region, and at least one optically transparent gate is located upon the gate dielectric and at least in-part over the channel region. Preferably, the at least one gate dielectric is also located over the photoactive region and the at least one optically transparent gate is also located at least in-part over the photoactive region, to provide enhanced charge transfer capabilities within the pixel sensor cell, which is typically a CMOS pixel sensor cell.

18 Claims, 4 Drawing Sheets

PIXEL SENSOR CELL, METHODS AND DESIGN STRUCTURE INCLUDING OPTICALLY TRANSPARENT GATE

CROSS REFERENCE TO RELATED APPLICATIONS

The present application is related to U.S. parent application Ser. No. 12/139,523, filed on Jun. 16, 2008.

BACKGROUND

1. Field of the Invention

This docket relates with BUR920080068US1. The invention relates generally to pixel sensor cells, methods for fabrication thereof and design structures for fabrication thereof. More particularly, the invention relates to pixel sensor cells with enhanced charge transfer performance.

2. Description of the Related Art

Solid state sensors are popular optoelectronic components that find use in various technology applications, including in particular imaging technology applications. Particularly common are solid state sensors that are used as active light capture and imaging elements within digital cameras.

Solid state image sensors may be fabricated using any of several semiconductor technologies for the active light capture and imaging elements. Charge coupled devices are known as more traditional solid state image sensor light capture and imaging elements. Complementary metal oxide semiconductor (CMOS) devices provide yet another semiconductor based active light capture and imaging element for use within a solid state image sensor. Solid state image sensors predicated upon CMOS semiconductor devices are generally more desirable insofar as such CMOS based solid state image sensors typically consume less power in comparison with other types of solid state image sensors.

While solid state image sensors in general, and CMOS image sensors more particularly, are desirable within the optoelectronic component fabrication art, solid state image sensors in general, and CMOS image sensors more particularly, are not entirely without problems. In particular, performance enhancements, such as charge transfer performance enhancements, are often desirable within solid state sensors in general and solid state image sensors more particularly, in order to assure accurate and timely charge transfer accuracy and fidelity.

Various solid state sensor structures and designs, and methods for fabrication thereof, are known in the optoelectronic art.

For example, Wan et al., in U.S. Pat. No. 4,807,004, teaches a charge coupled device (CCD) image sensor with enhanced imaging performance. The charge coupled device image sensor uses a tin oxide layer, selectively doped portions of which serve as electrodes and abutting selectively undoped portions of which serve as insulators.

In addition, Janesick, in U.S. Pat. No. 5,365,092, teaches a charge coupled device (CCD) image sensor with enhanced sensitivity to blue, ultraviolet and soft x-ray radiation. This particular charge coupled device (CCD) image sensor includes an ultra-thin layer of polysilicon that is located and formed over an entire array that otherwise comprises the charge coupled device (CCD) image sensor.

Further, Anagnostapoulous et al., in U.S. Pat. No. 5,798,542 and U.S. Pat. No. 5,804,845, teaches a charge coupled device (CCD) image sensor with enhanced electrical performance. The charge coupled device (CCD) image sensor uses an optically transparent indium tin oxide electrode, in conjunction with either: (1) overlapping color filter layers; or (2) a silicon oxide and silicon nitride composite gate dielectric.

Finally, Losee, in U.S. Pat. No. 5,891,752, teaches yet another charge coupled device (CCD) image sensor with enhanced electrical performance. This particular charge coupled device (CCD) image sensor includes transparent indium tin oxide electrodes that are separated by a silicon oxide dielectric material.

Solid state sensors, including charge coupled device (CCD) image sensors and further including in particular complementary metal oxide semiconductor (CMOS) image sensors, are likely to be of continued interest and continued importance as solid state sensor technology advances. Thus, desirable are solid state sensors, methods for fabrication thereof and design structures for fabrication thereof, as well as related component sub-structures, that provide for improved charge transfer efficiency within the solid state sensors.

SUMMARY

The invention provides a pixel sensor cell, a method for fabricating or operating the pixel sensor cell and a design structure for fabricating the pixel sensor cell. The pixel sensor cell typically but not exclusively comprises a complementary metal oxide semiconductor (CMOS) pixel sensor cell that includes at least one transistor that includes an optically transparent gate. The at least one optically transparent gate is at least in-part interposed between a photoactive region (i.e., typically a photodiode) and a floating diffusion region (i.e., typically a source and drain region) within a semiconductor substrate. Preferably, the optically transparent gate is located at least in-part over the photoactive region within the semiconductor substrate, and when so located and electrically biased, the pixel sensor cell need not include a pinning layer with respect to the photoactive region.

A particular pixel sensor cell in accordance with the invention includes a semiconductor substrate including a photoactive region laterally separated from a floating diffusion region by a channel region. This particular pixel sensor cell also includes at least one gate dielectric located upon the semiconductor substrate and at least in-part over the channel region. This particular pixel sensor cell also includes an optically transparent gate located upon the gate dielectric and also at least in-part over the channel region.

Another particular CMOS pixel sensor cell in accordance with the invention includes a semiconductor substrate including a photoactive region laterally separated from a floating diffusion region by a channel region. This other particular pixel sensor cell also includes at least one gate dielectric located upon the semiconductor substrate and at least in-part over the photoactive region and the channel region. This other pixel sensor cell also includes at least one optically transparent gate located upon the gate dielectric and also at least in-part over the photoactive region and at least in-part over the channel region. This other pixel sensor cell also includes at least two additional gates located upon the gate dielectric and at least in-part over the channel region, the at least one optically transparent gate and the at least two additional gates in series connection.

A particular design structure for fabricating a pixel sensor cell in accordance with the invention includes a design structure embodied in a machine readable medium, where the design structure includes a pixel sensor cell including a semiconductor substrate including a photoactive region laterally separated from a floating diffusion region by a channel region. The pixel sensor cell also includes at least one gate dielectric located upon the semiconductor substrate and at least in-part over the channel region. The pixel sensor cell also includes at least one optically transparent gate located upon the gate dielectric and also at least in-part over the channel region.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The invention, which includes a pixel sensor cell, a method for fabricating or operating the pixel sensor cell and a design structure for fabricating the pixel sensor cell, is understood within the context of the description set forth below. The description set forth below is understood within the context of the drawings described above. Since the drawings are intended for illustrative purposes, the drawings are not necessarily drawn to scale.

Figure 1:
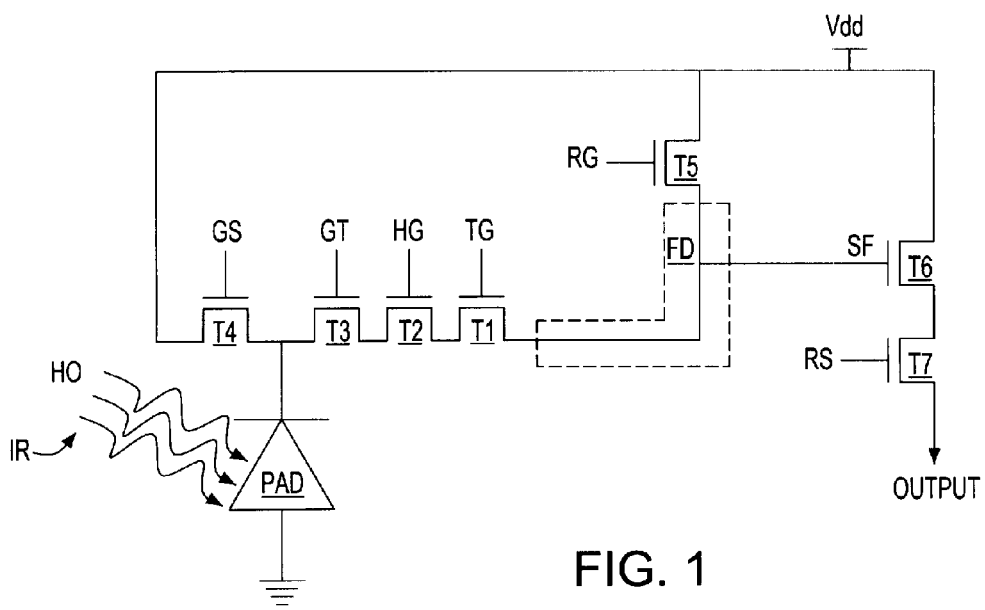
FIG. 1 shows a schematic circuit layout diagram of a CMOS pixel sensor cell in accordance with a generalized embodiment of the invention.

FIG. 1 shows a schematic circuit layout diagram illustrating a layout of electrical circuit components within a CMOS pixel sensor cell generally in accordance with the invention.

FIG. 1 first shows a photoactive device PAD, in the form of a photodiode, which as will be illustrated in greater detail within the context of schematic cross-sectional diagrams of particular embodiments of the invention that follow, is located and formed within a semiconductor substrate. Incident radiation IR may be incident upon the photoactive device PAD and provide for generation of a particular measurable and classifiable charge within the photoactive device PAD. The charge is gated through several transistors T3, T2 and T1 that are located and serially connected within a loop. The transistors that are serially connected within the loop include a global shutter GS transistor T4 that is located and connected to the output of the photoactive device PAD. Also connected to the output of the photoactive device PAD in a progressive series are a global transfer GT transistor T3, a hold gate HG transistor T2 and a transfer gate TG transistor T1. A floating diffusion FD is located and formed interposed between the transfer gate TG transistor T1 and a reset gate RG transistor T5. A serial electrical connection of the reset gate RG transistor T5 to the global shutter GS transistor T4 completes the five transistor loop as illustrated within the left hand side of the schematic circuit layout diagram of FIG. 1.

The right hand side of the schematic circuit layout diagram of FIG. 1 shows a source follower SF transistor T6 in series with a row select RS transistor T7. A voltage source Vdd connects to one side of the source follower SF transistor T6 and also connects to the five transistor loop that includes transistors T1 to T5 at a location interposed between the global shutter GS transistor T4 and the reset gate RG transistor T5. Finally, a gate of the source follower SF transistor T6 is connected to the floating diffusion FD.

As is understood by a person skilled in the art, and given an appropriate switching state of the each of the individual transistors T1 to T7, a particular CMOS pixel sensor cell output from the CMOS pixel sensor cell whose schematic circuit layout diagram is illustrated in FIG. 1 is monitored at the unconnected output (i.e., source or drain region) of the row select RS transistor T7.

As is further understood by a person skilled in the art, and as will be illustrated in greater detail within the context of the particular descriptions of the particular embodiments that follow, the aggregate of transistors T3, T2 and T1 provides a serial pathway through which photogenerated charge (i.e., photogenerated current) from the photoactive device PAD must travel in order to actuate the source follower SF transistor T6, to in turn allow for an output signal from the CMOS pixel sensor cell whose schematic circuit layout diagram is illustrated in FIG. 1.

Thus, in light of the particular circuit layout within the CMOS pixel sensor cell whose schematic circuit layout diagram is illustrated in FIG. 1, an operational efficiency for charge transfer within the CMOS pixel sensor cell of FIG. 1 is determined at least in part, or limited at least in part, by a gate spacing with respect to the series of gates for the transistors T1 to T3, as well as an aggregate channel length for the series of transistors T1 to T3.

It is towards providing a pixel sensor cell, such as the CMOS pixel sensor cell in accordance with the schematic circuit layout diagram of FIG. 1, with enhanced charge transfer capabilities that the present invention is directed. To that end, further attention is drawn to the portion of the CMOS pixel sensor cell whose schematic circuit layout diagram is illustrated in FIG. 1 that particularly includes that photoactive device PAD, the transistors T3 to T1 and the floating diffusion FD. Particular aspects of those components within the CMOS pixel sensor cell whose schematic circuit layout diagram is illustrated in FIG. 1 are discussed below within the context of more particular embodiments of the invention.

Figure 2:
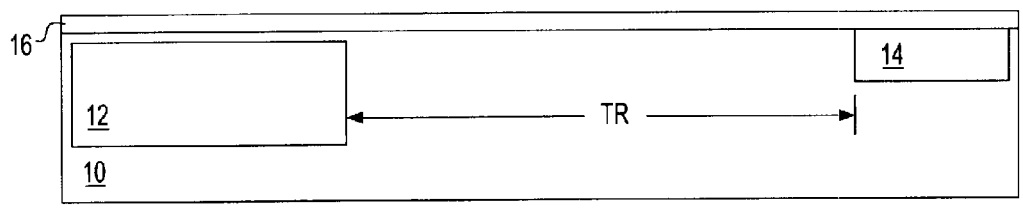
FIG. 2 to FIG. 4 show a series of schematic cross-sectional diagrams illustrating the results of progressive stages in fabricating a portion of the CMOS pixel sensor cell whose schematic circuit layout diagram is illustrated in FIG. 1 in accordance with a more particular embodiment of the invention.
Figure 3:
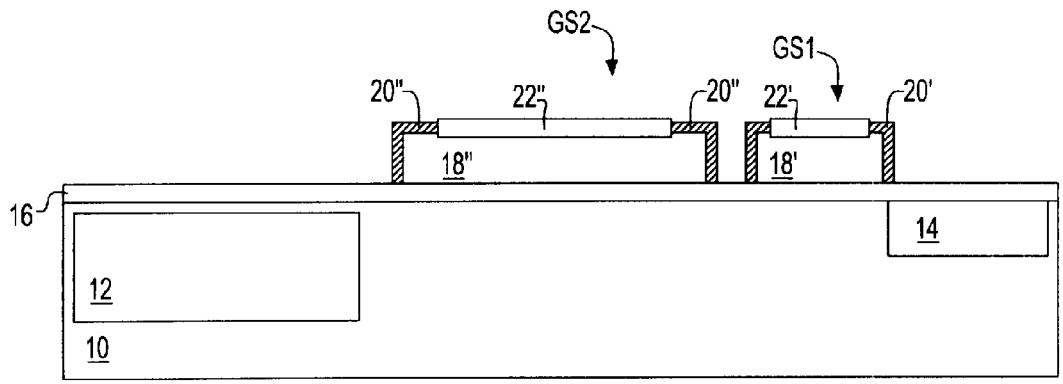
Figure 4:
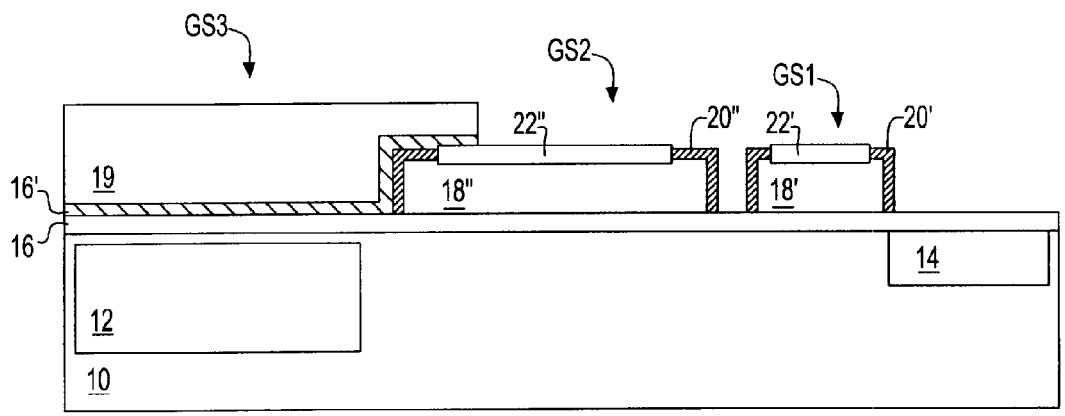

FIG. 2 to FIG. 4 show a series of schematic cross-sectional diagrams illustrating the results of progressive stages in fabricating a semiconductor structure that encompasses the photoactive device PAD, the gate within the global transfer GT transistor T3, the gate within the hold gate HG transistor T2, the gate within the transfer gate TG transistor T1 and the floating diffusion FD, within the CMOS pixel sensor cell whose schematic circuit layout diagram is illustrated in FIG. 1. The schematic cross-sectional diagrams of FIG. 2 to FIG. 4 illustrate a more particular embodiment of the invention that comprises a first embodiment of the invention. FIG. 2 shows a schematic cross-sectional diagram of the semiconductor structure at an early stage in the fabrication thereof in accordance with this more particular first embodiment.

FIG. 2 shows a semiconductor substrate 10 that includes a photoactive region 12 that is separated from a floating diffusion region 14 that is also located within the semiconductor substrate 10. The photoactive region 12 and the floating diffusion region 14 are separated by a transistor region TR (i.e., a channel region) that is intended to accommodate the transistors T1 to T3 that are illustrated in FIG. 1. FIG. 2 otherwise also illustrates a gate dielectric 16 located and formed upon the transistor region TR, and also covering the photoactive region 12 and the floating diffusion region 14. Within FIG. 2, the photoactive region 12 is intended to correspond with the photoactive device PAD that is illustrated in FIG. 1. In addition, the floating diffusion region 14 is intended to correspond with the floating diffusion FD that is illustrated in FIG. 1.

Within this particular first embodiment, each of the semiconductor substrate 10, the photoactive region 12, the floating diffusion region 14 and gate dielectric 16 may comprise materials, have dimensions and be formed using methods, that are otherwise generally conventional in the semiconductor fabrication art.

For example, the semiconductor substrate 10 may comprise any of several semiconductor materials that may be appropriately processed or doped to form a photoactive region. Non-limiting examples of such semiconductor materials include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials.

Although this particular embodiment illustrates the invention within the context of a bulk semiconductor substrate as the semiconductor substrate 10, neither this embodiments nor the invention are necessarily intended to be so limited. Rather, the embodiments and the invention also contemplate the use of semiconductor substrates other than bulk semiconductor substrates, for the semiconductor substrate 10. Such other semiconductor substrates may include, but are not necessarily limited to, semiconductor-on-insulator substrates and hybrid orientation substrates. Semiconductor-on-insulator substrates include a base semiconductor substrate separated from a surface semiconductor layer by a buried dielectric layer. Hybrid orientation substrates include separated semiconductor regions of different crystallographic orientation.

Next, the photoactive region 12 typically comprises a photodiode, and more particularly an n photodiode. Typically the photodiode has a dopant concentration from about $1 \times 10^{16}$ to about $1 \times 10^{18}$ dopant atoms per cubic centimeter, while adjacent and adjoining portions of the semiconductor substrate have an opposite polarity dopant concentration from about $1 \times 10^{14}$ to about $1 \times 10^{16}$ dopant atoms per cubic centimeter. Typically, the photoactive region 12 has a linewidth from about 200 to about 10000 nanometers within the semiconductor substrate 10 and a depth from about 100 to about 10000 nanometers within the semiconductor substrate 10.

As is illustrated in the schematic cross-sectional diagram of FIG. 2, the photoactive region 12 is typically recessed beneath a surface of the semiconductor substrate 10 (i.e., from about 100 to about 500 nanometers), although such a specific recessed location of the photoactive region 12 with respect to the semiconductor substrate 10 is also not specifically a limitation of the embodiments or of the invention.

Further, the floating diffusion region 14 is otherwise generally analogous to a source and drain region that is otherwise typically used for fabricating a field effect transistor within the semiconductor substrate 10 that is illustrated in FIG. 2. Typically, the floating diffusion region 14 has a polarity (i.e., conductivity type) identical to the photoactive region 12. Typically, the floating diffusion region 14 has a dopant concentration from about $1 \times 10^{18}$ to about $1 \times 10^{21}$ dopant atoms per cubic centimeter. Typically, the floating diffusion region 14 has a linewidth from about 200 to about 2000 nanometers within the semiconductor substrate 10 and a depth from about 0 to about 500 nanometers within the semiconductor substrate 10.

Finally, the gate dielectric 16 may comprise conventional dielectric materials such as oxides, nitrides and oxynitrides of silicon that have a dielectric constant from about 4 (i.e., typically a silicon oxide) to about 8 (i.e., typically a silicon nitride), measured in vacuum. Alternatively, the gate dielectric 16 may comprise generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The gate dielectric 16 may be formed using any of several methods that are appropriate to its material of composition. Non-limiting examples include thermal or plasma oxidation or nitridation methods, chemical vapor deposition methods (including atomic layer deposition methods) and physical vapor deposition methods. Typically, the gate dielectric 16 comprises a thermal silicon oxide dielectric material that has a thickness from about 1 to about 20 nanometers.

FIG. 3 shows a schematic cross-sectional diagram illustrating the results of further processing of the semiconductor structure whose schematic cross-sectional diagram is illustrated in FIG. 2

FIG. 3 shows a first gate structure GS1 and a second gate structure GS2 that are located and formed upon the gate dielectric 16 and over the transistor region TR (i.e., channel region) of the semiconductor substrate 10 that is interposed between the photoactive region 12 and the floating diffusion region 14 within the semiconductor substrate 10. Each of the first gate structure GS1 and the second gate structure GS2 comprises: (1) a corresponding gate 18' or 18" located and formed upon the gate dielectric 16; (2) a corresponding spacer 20' or 20" located and formed upon a sidewall of the gate 18' or 18" and leaving exposed at least a top central portion of the gate 18' or 18"; and (3) a corresponding silicide layer 22' or 22" located and formed upon a top central portion of the gate 18' or 18".

The gates 18' and 18" may comprise materials including but not limited to certain metals, metal alloys, metal nitrides and metal silicides, as well as laminates thereof and composites thereof. The gates 18' and 18" may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, each of the gates 18' and 18" comprises a doped polysilicon material that has a thickness from about 100 to about 500 nanometers.

The spacers 20' and 20" typically comprise a dielectric spacer material. Candidate dielectric spacer materials again include oxides, nitrides and oxynitrides of silicon. Also, oxides, nitrides and oxynitrides of other elements are not excluded. The spacers 20' and 20" are formed using a blanket layer deposition and anisotropic etchback method that uses an anisotropic etching plasma for etching purposes. Typically, the spacers 20' and 20" may comprise a silicon oxide material.

Although illustrated within FIG. 3 as conformal layers, the spacers 20' and 20" may also comprise a generally conventional spacer shape.

The silicide layers 22' and 22" may comprise any of several silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Others of the above enumerated silicide forming metals are less common. Typically, the silicide layers 22' and 22" are formed using a salicide method when the gates 18' and 18" comprise a silicon material, such as but not limited to a polysilicon material. Such a salicide method includes: (1) forming a blanket silicide forming metal layer upon the gates 18' and 18", and the spacers 20' and 20" (2) thermally annealing the blanket silicide forming metal layer with silicon surfaces which it contacts to selectively form the silicide layers 22' and 22" while leaving unreacted metal silicide forming metal layers on, for example, the spacers 20' and 20"; and (3) selectively stripping unreacted portions of the silicide forming metal layers from, for example, the spacers 20' and 20". Typically, the silicide layers 22' and 22" comprise a nickel silicide material or a cobalt silicide material that has a thickness from about 10 to about 50 nanometers.

FIG. 4 shows a schematic cross sectional diagram illustrating the results of further fabrication of the semiconductor structure whose schematic cross-sectional diagram is illustrated in FIG. 3.

FIG. 4 shows a gate dielectric 16' located and formed upon adjoining exposed portions of the gate dielectric 16, the spacer 20" and the silicide layer 22", and also located over the photoactive region 12 within the semiconductor substrate 10. FIG. 4 also shows an optically transparent gate 19 (i.e., which comprises a gate structure GS3) located and formed upon the gate dielectric 16', and also located over the photoactive region 12 within the semiconductor substrate.

Within this particular embodiment, the gate dielectric 16' may comprise materials, have dimensions and be formed using methods, that are analogous, equivalent or identical to the materials, dimensions and methods that are used for forming the gate dielectric 16, given the proviso that the gate dielectric 16 and the gate dielectric 16' both comprise a material, or comprise separate materials, that are optically transparent to incoming radiation that is intended to be incident upon the photoactive region 12 (i.e., to which the photoactive region 12 is sensitive). Within the context of a CMOS pixel sensor cell that is intended to be operative in the visible wavelength region, a silicon oxide, silicon nitride or silicon oxynitride dielectric material will typically fulfill the foregoing optical characteristics for the gate dielectric 16 and the gate dielectric 16'. This particular embodiment is not, however, so limited.

Within this particular embodiment, the optically transparent gate 19 will, from a practical perspective, comprise an optically transparent and electrically conductive metal oxide, although the invention is not intended to be so limited. Typically, optically transparent metal oxides that may be used to fabricate the optically transparent gate 19 include, but are not limited to tin oxides and indium-tin oxides. Such optically transparent and electrically conductive metal oxides may be formed using methods including but not limited to chemical vapor deposition methods, physical vapor deposition methods and ion implantation methods. Typically, the optically transparent gate 19 has a thickness from about 100 to about 500 nanometers.

FIG. 4 shows a schematic cross-sectional diagram illustrating a semiconductor structure that includes portion of a CMOS pixel sensor cell in accordance with a first particular embodiment of the invention. The semiconductor structure includes three gate structures GS1, GS2 and GS3 located and formed at least in-part over a channel region interposed between a photoactive region 12 and a floating diffusion region 14 that in turn are located within a semiconductor substrate 10. As is illustrated in FIG. 4, a particular gate structure G3 comprises an optically transparent gate 19 that is located and formed at least in-part over the photoactive region 12, in addition to being located at least in-part over the channel region interposed between the photoactive region 12 and the floating diffusion region 14.

The semiconductor structure whose schematic cross-sectional diagram is illustrated in FIG. 4 provides value insofar as by overlapping the gate structure GS2 by the gate structure GS3, as well as by overlapping the photoactive region 12 by the gate structure GS3, enhanced charge transfer from the photoactive region 12 to the floating diffusion 14 may be effected. Similarly, by overlapping the photoactive region 12 by the optically transparent gate 19, the optically transparent gate 19 may be electrically biased and thus pin the photodiode region 12, which will minimize dark current and provide enhanced low light operation of the CMOS pixel sensor cell whose schematic cross-sectional diagram is illustrated in FIG. 1. Under such circumstances, this particular embodiment provides for avoidance of an independent and separate pinning layer that may be otherwise needed located and formed upon the photoactive region 12.

FIG. 5 to FIG. 8 show a series of schematic cross-sectional diagrams illustrating the results of progressive stages in fabricating a semiconductor structure in accordance with another more particular embodiment of the invention that comprises a second embodiment of the invention. This particular semiconductor structure relates generally to the semiconductor structure in accordance with the first embodiment.

Figure 5:
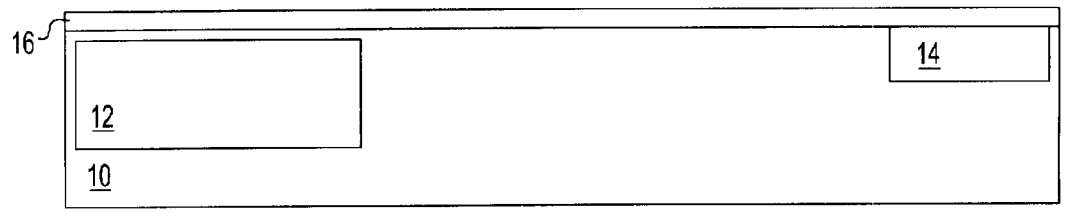
FIG. 5 to FIG. 8 show a series of schematic cross-sectional diagrams illustrating the results of progressive stages in fabricating the same portion of the CMOS pixel sensor cell whose schematic circuit layout diagram is illustrated in FIG. 1 in accordance with another more particular embodiment of the invention.

FIG. 5 corresponds with FIG. 2. Like or identical layers and structures within FIG. 2 and FIG. 5 are designated identically.

Figure 6:
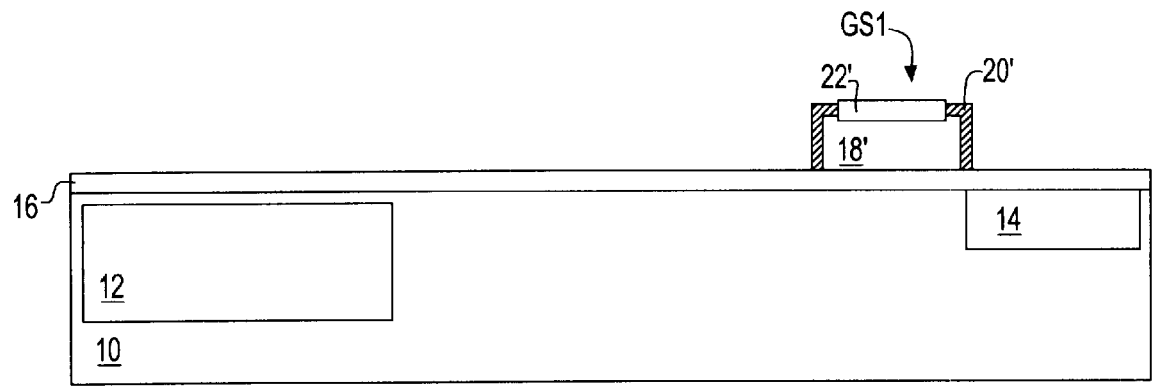

FIG. 6 corresponds generally with FIG. 3, but with the formation of only one gate structure GS1 upon the gate dielectric 16 rather than two gate structures GS1 and GS2 that are illustrated in FIG. 3. Otherwise, like or identical layers and structures within the semiconductor structures of FIG. 6 and FIG. 3 are designated identically.

Figure 7:
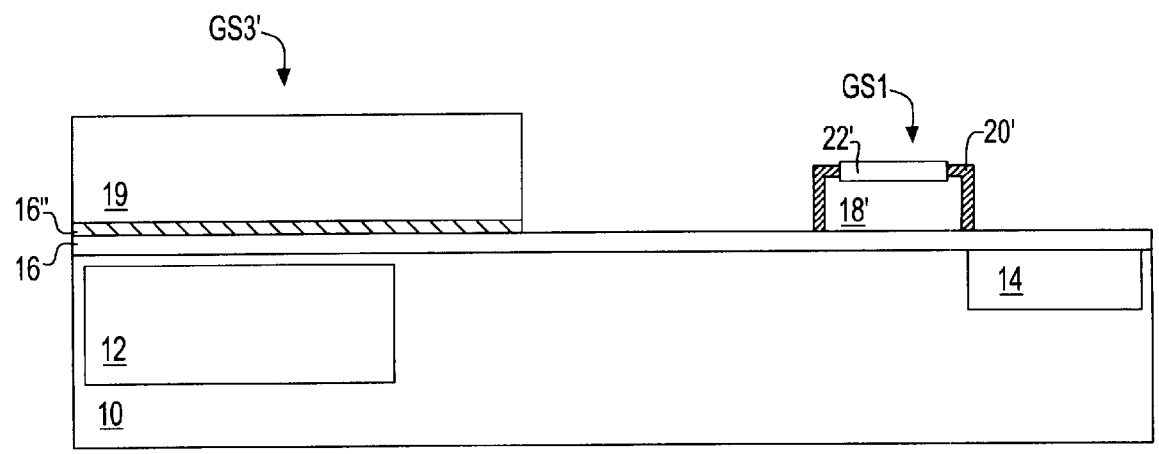

FIG. 7 shows a third gate structure GS3' located and formed at least in-part over the photoactive region 12 and at least in-part over the transistor region (i.e., channel region) within the semiconductor substrate 10 interposed between the photoactive region 12 and the floating diffusion region 14. The third gate structure GS3' includes a gate dielectric 16" that is located and formed upon the gate dielectric 16, as well as a transparent gate 19' that is located and formed upon the gate dielectric 16".

Within this additional second embodiment, the gate dielectric 16" may comprise materials, have dimensions and be formed using methods that are analogous, equivalent or identical to the materials, dimensions and methods that are used for forming the gate dielectric 16. Within this particular additional second embodiment, the optically transparent gate 19' may comprise materials, have dimensions and be formed using methods analogous, equivalent of identical to the materials, dimensions and methods used for forming the optically transparent gate 19 that is illustrated in FIG. 4.

Figure 8:
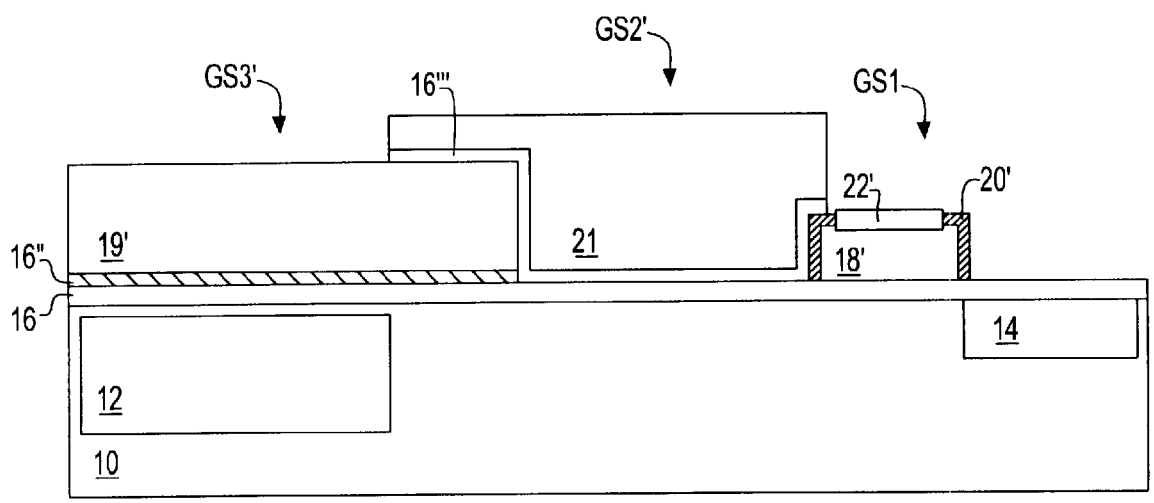

FIG. 8 shows a schematic cross-sectional diagram illustrating the results of further processing of the semiconductor structure of FIG. 7.

FIG. 8 shows a gate structure GS2' located and formed interposed and overlapping the first gate structure GS1 and the third gate structure GS3'.

The second gate structure GS2' includes a gate dielectric 16''' located and formed upon exposed portions of at least the gate dielectric 16 the spacer 20' and the optically transparent gate 19'. The gate dielectric 16''' may otherwise comprise materials, have dimensions and be formed using methods analogous, equivalent or identical to the materials, dimensions and methods used for forming gate dielectrics 16, 16' and 16''. The second gate structure GS2' also includes a gate 21 located and formed upon the gate dielectric 16'''. The gate 21 may otherwise comprise materials, have dimensions and be formed using methods analogous, equivalent or identical to the gates 18', 18'', 19 and 19', as well as additional methods and materials. Such additional gate methods and materials may include, but are not necessarily limited to metal gate methods and materials.

FIG. 8 shows a schematic cross-sectional diagram of a semiconductor structure in accordance with another embodiment of the invention that comprises a second embodiment of the invention. This particular second embodiment of the invention differs from the foregoing first embodiment of the invention insofar as all three gate structures GS1, GS2' and GS3' abut and overlap, and where the particular gates 18', 21 and 19' are separated at least in-part by the gate dielectric 16'''. The semiconductor structure whose schematic cross-sectional diagram is illustrated in FIG. 8 thus provides, beyond and in comparison with the semiconductor structure whose schematic cross-sectional diagram is illustrated in FIG. 4, a more optimized charge transfer performance, due to complete overlap and abutment of the gate structures GS1, GS2' and GS3' located over the channel region.

While the preferred embodiments illustrate the invention within the context of three gates that correspond with T1, T2 and T3 as specified within the schematic circuit layout diagram of FIG. 1 interposed at least in-part between the photoactive region 12 and the floating diffusion region 14, the embodiments and the invention are not intended to be so limited. Rather a greater or lesser number of gates and transistors may be used in place of the transistors T1, T2 and T3. As well, the ordering and/or functioning of the transistors T1, T2 and T3 may also be changed.

Figure 9:
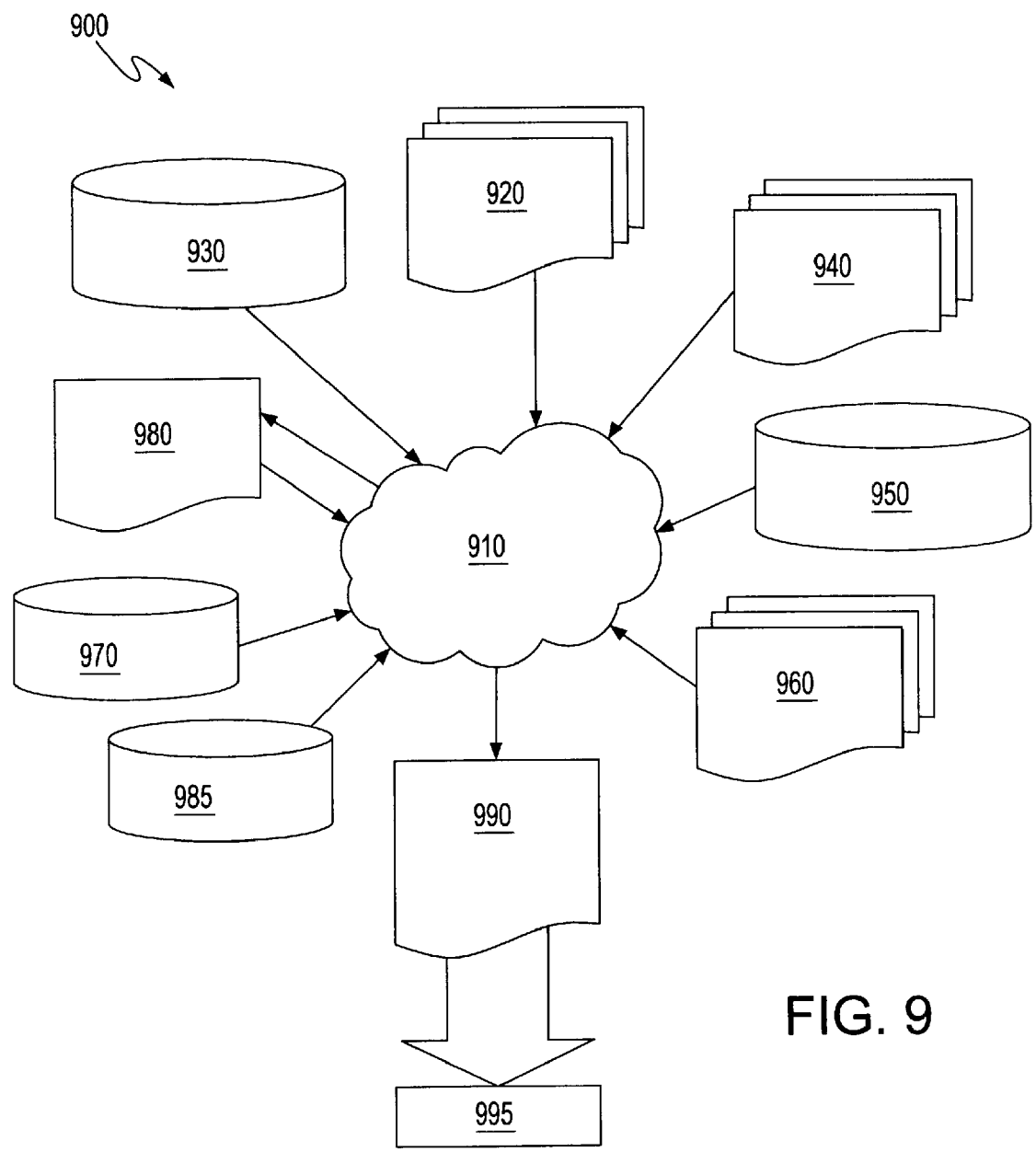
FIG. 9 shows a schematic flow diagram of a design process used in semiconductor design, manufacture and/or test, that is applicable to the schematic circuit layout diagram and components thereof that are illustrated in FIG. 1, FIG. 4 and FIG. 8.

FIG. 9 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIG. 1, FIG. 4 and FIG. 8 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 1 in conjunction with FIG. 4 or FIG. 8. Design process 910 preferably synthesizes (or translates) an embodiment of the invention as shown in FIG. 1 in conjunction with FIG. 4 or FIG. 8 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 1 in conjunction with FIG. 4 or FIG. 8, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1 in conjunction with FIG. 4 or FIG. 8. Design structure 990 may then proceed to a stage 995 where, for example, design structure 990: proceeds to tape-out, is released to manufacturing, is released to a mask house, is sent to another design house, is sent back to the customer, etc.

The preferred embodiments are illustrative of the invention rather than limiting of the invention. Revisions and modifications may be made to methods, materials, structures and dimensions of a semiconductor structure included within a CMOS pixel sensor cell in accordance with the preferred embodiments, while still providing a CMOS pixel sensor cell, a method for fabricating the CMOS pixel sensor cell and a design structure for fabricating the CMOS pixel sensor cell in accordance with the invention, further in accordance with the accompanying claims.

What is claimed is:

1. A pixel sensor cell comprising:
   a semiconductor substrate including a photoactive region laterally separated from a floating diffusion region by a channel region, the channel region including at least one gate conductor;
   a first gate dielectric layer being present on an upper surface of the semiconductor substrate at least overlying the photoactive region and disposed between the at least one gate conductor and the channel region of the semiconductor substrate;
   a second gate dielectric layer being present on a portion of the first gate dielectric layer that is overlying the photoactive region and is present overlying the channel region on an upper surface of the at least one gate conductor, wherein the second gate dielectric layer is a single layer extending from the photoactive region to the channel region of the substrate; and at least one optically transparent gate conductor located upon the second gate dielectric layer and also at least in-part over the channel region.

2. The pixel sensor cell of claim 1 wherein:
the pixel sensor cell is a CMOS pixel sensor cell; and
the at least one optically transparent gate is optically transparent to a wavelength of radiation to which the photoactive region is sensitive.

3. The pixel sensor cell of claim 1 further comprising at least one additional gate located upon the first gate dielectric layer and also over the channel region.

4. The pixel sensor cell of claim 3 wherein the at least one additional gate is not optically transparent.

5. The pixel sensor cell of claim 3 wherein the at least one additional gate and the optically transparent gate overlap.

6. The pixel sensor cell of claim 1 wherein the at least one optically transparent gate comprises an optically transparent electrically conductive oxide material.

7. The pixel sensor cell of claim 1 wherein the pixel sensor cell comprises at least seven transistors.

8. A CMOS pixel sensor cell comprising:
a semiconductor substrate including a photoactive region laterally separated from a floating diffusion region by a channel region, the channel region including at least one gate conductor;
a first gate dielectric layer being present on an upper surface of the semiconductor substrate at least overlying the photoactive region and disposed between the at least one gate conductor and the channel region of the semiconductor substrate;
a second gate dielectric layer being present on a portion of the first gate dielectric layer that is overlying the photoactive region and is present overlying the channel region on an upper surface of the at least one gate conductor, wherein the second gate dielectric layer is a single layer extending from the photoactive region to the channel region of the substrate;
at least one optically transparent gate located upon the second gate dielectric layer and also at least in-part over the photoactive region and at least in-part over the channel region; and
at least two additional gates located upon the first gate dielectric layer and at least in-part over the channel region, the at least one optically transparent gate and the at least two additional gates in series connection.

9. A design structure embodied in a machine readable medium, the design structure including a pixel sensor cell comprising:

a semiconductor substrate including a photoactive region laterally separated from a floating diffusion region by a channel region, the channel region including at least one gate conductor;
a first gate dielectric layer being present on an upper surface of the semiconductor substrate at least overlying the photoactive region and disposed between the at least one gate conductor and the channel region of the semiconductor substrate;
a second gate dielectric layer being present on a portion of the first gate dielectric layer that is overlying the photoactive region and is present overlying the channel region on an upper surface of the at least one gate conductor, wherein the second gate dielectric layer is a single layer extending from the photoactive region to the channel region of the substrate; and
at least one optically transparent gate conductor located upon the second gate dielectric layer and also at least in-part over the channel region, wherein the at least one optically transparent gate conductor is also formed at least in part over the photoactive region and is isolated from the at least one gate conductor in the channel region by the second gate dielectric layer that is formed on that at least one gate conductor.

10. The design structure of claim 9 wherein the design structure comprises a netlist.

11. The design structure of claim 9 wherein the design structure resides on a storage medium as a data format used for exchange of layout data of integrated circuits.

12. The design structure of claim 9 wherein:
the pixel sensor cell is a CMOS pixel sensor cell; and
the at least one optically transparent gate is optically transparent to a wavelength of radiation to which the photoactive region is sensitive.

13. The design structure of claim 9 further comprising at least one additional gate located upon the first gate dielectric layer and also over the channel region.

14. The design structure of claim 13 wherein the at least one additional gate is not optically transparent.

15. The design structure of claim 13 wherein the at least one additional gate and the optically transparent gate overlap.

16. The design structure of claim 9 wherein the at least one optically transparent gate comprises an optically transparent electrically conductive oxide material.

17. The design structure of claim 9 wherein the pixel sensor cell comprises at least seven transistors.

18. The design structure of claim 9 wherein the at least one optically transparent gate comprises a global transfer gate.

* * * * *